United States Patent
Mori (12) 
(10) Patent No.: US 6,175,281 B1
(45) Date of Patent: Jan. 16, 2001

(54) PLL FREQUENCY SYNTHESIZER AND PORTABLE TERMINAL EMPLOYING THE PLL FREQUENCY SYNTHESIZER

(75) Inventor: Kazuhiro Mori, Tokyo (JP)

(73) Assignee: Mitsubishi Denki Kabushiki Kaisha, Tokyo (JP)

(*) Notice: Under 35 U.S.C. 154(b), the term of this patent shall be extended for 0 days.

(21) Appl. No.: 09/202,414

(22) PCT Filed: Apr. 14, 1997

(86) PCT No.: PCT/JP97/01277

§ 371 Date: Dec. 30, 1998

§ 102(e) Date: Dec. 30, 1998

(87) PCT Pub. No.: WO98/47232

PCT Pub. Date: Oct. 22, 1998

(51) Int. Cl.[7] ........................................ H03L 7/08
(52) U.S. Cl. ................... 331/17; 331/25; 331/14; 327/105; 327/156; 455/266; 455/260
(58) Field of Search ................... 331/17, 1 A, 14, 331/25; 455/266, 260; 327/156, 157, 159, 105

(56) References Cited

U.S. PATENT DOCUMENTS 5,461,344  10/1995  Andoh .................................. 331/1 A
5,519,887 * 5/1996  Lieu .................................... 455/266
5,559,474 * 9/1996  Matsumoto et al. ..................... 331/17

* cited by examiner

Primary Examiner—Arnold Kinkead
(74) Attorney, Agent, or Firm—Rothwell, Figg, Ernst & Manbeck (57) ABSTRACT

A PLL frequency synthesizer has: a reference frequency generator which issues a first frequency signal; a PLL section which outputs a phase error signal based on the first frequency signal and a second frequency signal; a first filter which smoothes the phase error signal output from the PLL section according to a first reference, and which outputs a first smoothed phase error signal; a second filter which smoothes the phase error signal output from the PLL section according to a second reference, and which outputs a second smoothed phase error signal; a switch which issues, in a switching mode, the first or second smoothed phase error signal output from the first filter or the second filter; an output frequency generator which issues a second frequency signal based on the first or second smoothed phase error signal to the PLL section; and a switch controller which controls the changeover of the switch.

18 Claims, 8 Drawing Sheets

PLL FREQUENCY SYNTHESIZER AND PORTABLE TERMINAL EMPLOYING THE PLL FREQUENCY SYNTHESIZER

FIELD OF THE INVENTION

The present invention relates to a PLL frequency synthesizer used for a portable terminal or the like.

BACKGROUND ART

An example of a conventional PLL frequency synthesizer will be described in conjunction with FIG. 10.

Figure 10:
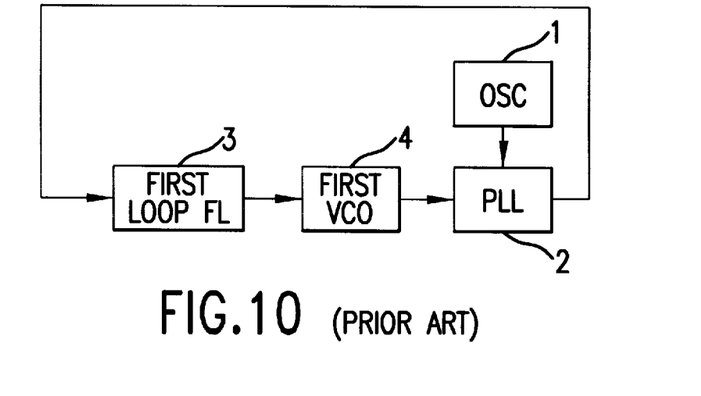
FIG. 10 is a block diagram showing a conventional PLL frequency synthesizer.

FIG. 10 is a block diagram showing the conventional PLL frequency synthesizer.

Referring to FIG. 10, reference numeral 1 denotes a reference frequency generator issuing a reference frequency signal.

Reference numeral 2 denotes a phase lock loop circuit (hereinafter referred to as "PLL circuit") which is connected to the reference frequency generator 1 to divide the reference frequency issued from the reference frequency generator 1 by N so as to provide a first frequency.

The PLL circuit 2 divides the output frequency received from a first VCO circuit 4 by M to provide a second frequency.

The PLL circuit 2 compares the phase of the first frequency obtained by dividing the output frequency by M with that of the second frequency obtained by dividing the reference frequency by N and outputs a phase error signal regarding the phase error of the first frequency and the second frequency.

Reference numeral 3 denotes a first loop filter (hereinafter referred to as "LOOP_FL") which is connected to the PLL circuit 2 and smoothes the phase error signal issued from the PLL circuit 2.

Reference numeral 4 denotes a first voltage controlled oscillator (hereinafter referred to as "VCO") circuit which is connected to a first LOOP_FL 3 and outputs a signal of the output frequency based on the phase error signal which has been smoothed by the first LOOP_FL 3.

The signals of the frequencies to be controlled by the conventional PLL frequency synthesizer are controlled by relational expression (1) given below.

And the conventional PLL frequency synthesizer outputs a plurality of types of frequency signals within a predetermined range that satisfies the following relational expression (1):

$$F0 = (M/N) \times FS \quad (1)$$

where F0 indicates output frequency, FS indicates reference frequency, M indicates the dividing number of output frequency, and N indicates the dividing number of reference frequency.

The mobile radio systems are shifting from analog systems to digital systems.

Some mobile radio systems are beginning to call for mobile terminals compatible with both analog systems and digital systems.

In general, the PLL frequency synthesizer in an analog system mobile terminal is required to have a higher signal-to-noise power ratio (hereinafter referred to as "S/N ratio") and a higher carrier-to-noise (hereinafter referred to as "C/N ratio") than those of a digital system PLL frequency synthesizer.

On the other hand, the PLL frequency synthesizer in a digital system mobile terminal is not required to provide such a high S/N ratio and C/N ratio as in the case of the PLL frequency synthesizer in the analog system mobile terminal, but it is required to have a quicker lockup time and a faster power rise than those in the analog system PLL frequency synthesizer.

The higher S/N ratio and C/N ratio conflict with the quicker lockup time and the faster power rise.

The PLL frequency synthesizer provided in the mobile terminal compatible with both analog system and digital system is required to provide a quicker lockup time and a faster power rise in a digital mode in which the digital system is used.

The PLL frequency synthesizer provided in the mobile terminal compatible with both analog system and digital system is also required to provide high S/N ratio and C/N ratio in an analog mode in which the analog system is used.

Hereinafter, the mobile terminal compatible with both digital system and analog system will be referred to as a "dual mode unit."

Most conventional mobile terminals are compatible with only one type of system.

Even when a mobile terminal compatible with both analog system and digital system is available, the mobile terminal is provided with a PLL frequency synthesizer required for an analog system and a PLL frequency synthesizer required for a digital system.

In other words, the conventional mobile terminal compatible with both analog system and digital system has been constructed by many components, making it extremely difficult to reduce the size of the mobile terminal. Furthermore, since the conventional mobile terminal is composed of many components, the manufacturing cost of the mobile terminal has been extremely high.

The present invention has been made with a view toward solving the problems, and it is an object of the invention to achieve a simpler constitution of a PLL frequency synthesizer of a mobile terminal compatible with a plurality of systems by sharing a part of the PLL frequency synthesizer of the mobile terminal compatible with a plurality of systems among the plurality of systems and to provide a PLL frequency synthesizer that permits lower manufacturing cost thereof.

DISCLOSURE OF THE INVENTION

According to the present invention, there is provided a PLL frequency synthesizer having: a reference frequency generator which issues a first frequency signal; a PLL section which is connected to the reference frequency generator, receives the first frequency signal and a second frequency signal, and outputs a phase error signal based on the first frequency signal and the second frequency signal; a first filter which is connected to the PLL section, smoothes the phase error signal output from the PLL section according to a first reference, and outputs a first smoothed phase error signal; a second filter which is connected to the PLL section, smoothes the phase error signal output from the PLL section according to a second reference, and outputs a second smoothed phase error signal; a switch which is connected to the first filter and the second filter and issues, in a switching mode, the first smoothed phase error signal or the second smoothed phase error signal output from the first filter or the second filter; an output frequency generator which is connected to the switch and the PLL section and issues a second frequency signal based on the first smoothed phase error signal or the second smoothed phase error signal to the PLL section; and a switch controller which is connected to the switch to control the changeover of the switch.

Further according to the present invention, there is provided a PLL frequency synthesizer having: a reference frequency generator which issues a first frequency signal; a PLL section which is connected to the reference frequency generator, receives the first frequency signal and a second frequency signal, and outputs a phase error signal based on the first frequency signal and the second frequency signal; a first filter which smoothes the phase error signal according to a first reference and outputs a first smoothed phase error signal; a second filter which smoothes the phase error signal according to a second reference, and outputs a second smoothed phase error signal; a switch which is connected between the PLL section and the first filter and the second filter, and which issues, in a switching mode, the phase error signal issued from the PLL section; an output frequency generator which is connected to the first filter, the second filter, and the PLL section, and which issues a second frequency signal based on the first smoothed phase error signal or the second smoothed phase error signal to the PLL section; and a switch controller which is connected to the switch to control the changeover of the switch.

Further, in the PLL frequency synthesizer in accordance with the present invention, the output frequency generator has a first power supply and a second power supply, so that the first power supply is selected when the switch is changed over to the connection with the first filter by the switch controller, while the second power supply is selected when the switch is changed over to the connection with the second filter by the switch controller.

Further, in the PLL frequency synthesizer in accordance with the present invention, the first power supply defines the time required for a rise as a first time and has less variations in output voltage, while the second power supply has more variations in output voltage than in the first power supply and defines the time required for a rise as a second time which is shorter than the first time.

Further, in the PLL frequency synthesizer in accordance with the present invention, the PLL section has a first frequency divider, a second frequency divider, and a comparator, wherein; the first frequency divider is connected to the reference frequency generator and it divides a received first frequency signal into a third frequency signal and issues it; the second frequency divider is connected to the output frequency generator and it divides a received second frequency signal into a fourth frequency signal and issues it; and the comparator is connected to the first frequency divider and the second frequency divider to compare the phases of the third frequency signal and the fourth frequency signal and it outputs a phase error signal based on a comparison result.

Further according to the present invention, there is provided a PLL frequency synthesizer having: a reference frequency generator which issues a first frequency signal; a PLL section which is connected to the reference frequency generator, receives the first frequency signal and a second frequency signal, and outputs a phase error signal based on the first frequency signal and the second frequency signal; a first filter which is connected to the PLL section, smoothes the phase error signal output from the PLL section according to a first reference, and outputs a first smoothed phase error signal; a second filter which is connected to the PLL section, smoothes the phase error signal output from the PLL section according to a second reference, and outputs a second smoothed phase error signal; a first output frequency generator which is connected to the first filter and which outputs a second frequency signal based on the first smoothed phase error signal; a second output frequency generator which is connected to the second filter and which outputs a second frequency signal based on the second smoothed phase error signal; a switch which is connected to the first output frequency generator, the second output frequency generator, and the PLL section and which outputs, in a switching mode, the first smoothed phase error signal issued from the first output frequency generator or the second smoothed phase error signal issued from the second output frequency generator; and a switch controller which is connected to the switch to control the changeover of the switch.

Further, in the PLL frequency synthesizer in accordance with the present invention, the PLL section has a first frequency divider, a second frequency divider, and a comparator, wherein: the first frequency divider is connected to the reference frequency generator and it divides a received first frequency signal into a third frequency signal and issues it; the second frequency divider is connected to the first output frequency generator or the second output frequency generator via the switch and it divides a received second frequency signal into a fourth frequency signal and issues it; and the comparator is connected to the first frequency divider and the second frequency divider to compare the phases of the third frequency signal and the fourth frequency signal and it outputs a phase error signal based on a comparison result.

Further, in the PLL frequency synthesizer in accordance with the present invention, a first reference of the first filter is used to set the cutoff frequency of the first filter to a first level, and a second reference of the second filter is used to set the cutoff frequency of the second filter at a second level that is higher than the first level.

A portable terminal employing a PLL frequency synthesizer in accordance with the present invention is a portable terminal which uses the PLL frequency synthesizer described in any one of claims 1, 2, and 6.

If the portable terminal employing a PLL frequency synthesizer in accordance with the present invention is used with a first system, then the first filter is used by changing over the switch, while if the portable terminal is used with a second system, then the second filter is used by changing over the switch.

In the portable terminal employing the PLL frequency synthesizer in accordance with the present invention, the first system is an analog system, while the second system is a digital system.

Further in the portable terminal employing the PLL frequency synthesizer in accordance with the present invention, the switch is changed over by the switch controller according to the intensity of a received signal of the portable terminal.

Further in the portable terminal employing the PLL frequency synthesizer in accordance with the present invention, the switch controller selects the first system when the intensity of an applied first received signal regarding the first system exceeds a predetermined standard, whereas it selects the second system when the intensity of the first received signal is lower than the predetermined standard.

Further in the portable terminal employing the PLL frequency synthesizer in accordance with the present invention, the switch controller compares the intensity of the first received signal regarding the first system with the intensity of the second received signal regarding the second system, and it selects the first system if the intensity of the first received signal is higher than the intensity of the second received signal or it selects the second system if the intensity of the second received signal is higher than the intensity of the first received signal.

Further in the portable terminal employing the PLL frequency synthesizer in accordance with the present invention, when the switch controller selects the first system, processing based on the first received signal regarding the first system that has been entered by the portable terminal is implemented, or when the switching controller selects the second system, processing based on the second received signal regarding the second system that has been entered by the portable terminal is implemented.

BEST MODE FOR CARRYING OUT THE INVENTION

The following will describe the embodiments of the present invention.

Embodiment 1

An embodiment of the PLL frequency synthesizer in accordance with the present invention will be described in conjunction with FIG. 1.

Figure 1:
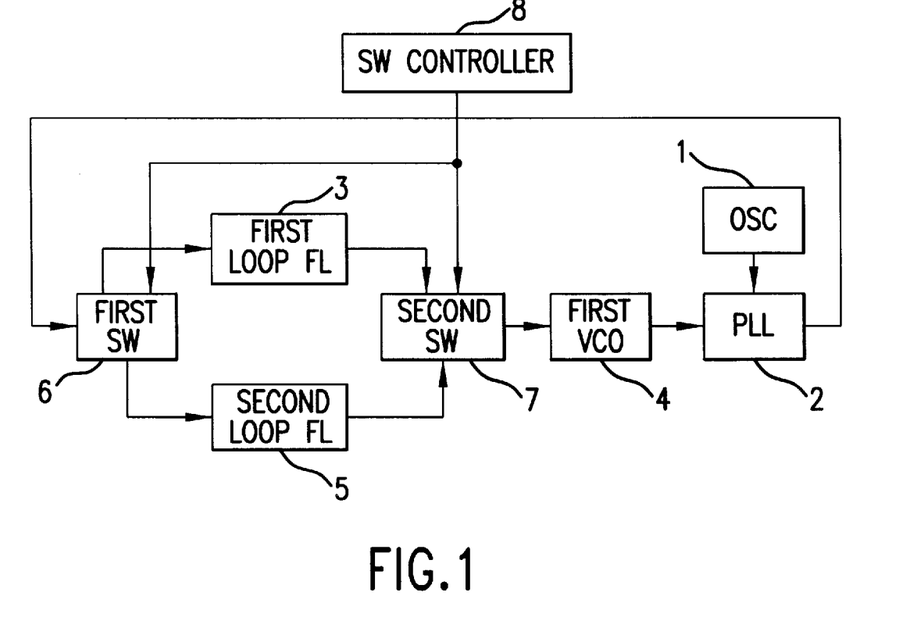
FIG. 1 is a block diagram showing a PLL frequency synthesizer of embodiment 1.

FIG. 1 is a block diagram of the PLL frequency synthesizer of embodiment 1.

Referring to FIG. 1, reference numeral 1 indicates a reference frequency generator which outputs a reference frequency signal.

Reference numeral 2 indicates a PLL circuit which is connected to the reference frequency generator 1 and which divides the reference frequency, which has been output from the reference frequency generator 1, by N to provide a first frequency.

PLL circuit 2 also divides the output frequency, which has been supplied from a first VCO circuit 4, by M to provide a second frequency.

The PLL circuit 2 compares the phase of the first frequency obtained by dividing the output frequency by M with the phase of the second frequency obtained by dividing the reference frequency by N and issues a phase error signal regarding the phase error of the first frequency and the second frequency.

Reference numeral 3 denotes a first LOOP_FL which is connected to the PLL circuit 2 via a first SW 6 and which smoothes the phase error signal output from the PLL circuit 2.

Reference numeral 5 denotes a second LOOP_FL which is connected to the PLL circuit 2 via the first SW 6 and which smoothes the phase error signal output from the PLL circuit 2.

Reference numeral 4 denotes a first VCO circuit which is connected to first LOOP_FL 3 and second LOOP_FL 5 via a second SW 7 and which issues an output frequency signal based on the phase error signal smoothed by the first LOOP_FL 3 or the second LOOP_FL 5.

Reference numeral 8 denotes a SW controller which is connected to the first SW 6 and the second SW 7 and which switches the connection between the first SW 6 and the second SW 7 to set whether the phase error signal issued from the PLL circuit 2 should be applied to the first LOOP_FL 3 or the second LOOP_FL 5.

Three methods for switching by the SW controller 8 will be illustrated below.

First, a first method will be described.

When power supply to a portable terminal compatible with a first system or a second system is begun, the first system is used first in the portable terminal.

The state in which the power supply to the portable terminal has begun is defined as the initial state.

Since the first system is used in the portable terminal in the initial state, the SW controller 8 in the portable terminal controls the synthesizer to match the first system.

While the first system is being used in the portable terminal, if the portable terminal is moved from an area wherein the first system is usable to an area wherein it is unusable, then the control for switching from the first system to the second system is conducted in the portable terminal.

And while the second system is being used in the portable terminal, the portable terminal monitors whether the first system can be used or not.

If the portable terminal decides that the first system can be used according to the result of the monitor on the first system, then the control for switching from the second system to the first system is conducted in the portable terminal.

If the portable terminal is moved into an area where neither the first system nor the second system can be used, then the portable terminal indicates that it is out of the service area.

A second method will now be described.

When power supply to a portable terminal compatible with the first system or the second system is begun, the first system is used first in the portable terminal.

The state in which the power supply to the portable terminal has begun is defined as the initial state.

Since the first system is used in the portable terminal in the initial state, the SW controller 8 in the portable terminal controls the synthesizer to match the first system.

While the first system is being used in the portable terminal, if the portable terminal is moved from an area wherein the first system is usable to an area wherein it is unusable, then the control for switching from the first system to the second system is conducted in the portable terminal.

While the second system is being used in the portable terminal, if the portable terminal is moved from an area wherein the second system is usable to an area wherein it is unusable, then the control for switching from the second system to the first system is conducted in the portable terminal.

If the portable terminal is moved into an area where neither the first system nor the second system can be used, then the portable terminal indicates that it is out of the service area.

A third method will now be described.

When power supply to a portable terminal compatible with the first system or the second system is begun, the control for using the first system is conducted first in the portable terminal.

And the portable terminal stores the receiving condition when the control for using the first system has been carried out.

The receiving state with the first system is defined as a first receiving state.

Then, the control for using the second system is carried out in the portable terminal.

And the portable terminal stores the receiving condition when the control for using the second system has been carried out.

The receiving state with the second system is defined as a second receiving state.

After that, these first receiving state and the second receiving state are compared, and the first or second system having a better receiving condition is selected and used.

When the first or second system having the better receiving state in the portable terminal (e.g. the first system) has been selected and in use, if the portable terminal is moved from an area wherein the first system is usable to an area wherein it is unusable, then the control for switching from the first system to the second system is conducted in the portable terminal.

The first or second method is used to switch from the second system to the first system.

The first SW 6 and the second SW 7 are set to provide electrical connection between the first VCO circuit 4, the PLL circuit 2, and the first LOOP_FL 3 or the second LOOP_FL 5.

Relational expression (1) given below is established between the output frequency output from the first VCO circuit 4 and the reference frequency output from the reference frequency generator 1.

Where F0 means the output frequency, FS means the reference frequency, M means the dividing number of the output frequency, and N is the dividing number of the reference frequency:

$$F0=(M/N) \times FS \quad (1)$$

For instance, the first LOOP_FL 3 is configured to provide a quicker lockup time of the PLL frequency synthesizer, and the second LOOP_FL 5 is configured to provide a good C/N ratio of the PLL frequency synthesizer.

The cutoff frequency for the first LOOP_FL 3 having a quicker lockup time of the PLL frequency synthesizer is set at a high value. The high cut off frequency of the first LOOP_FL 3, however, causes a poor C/N ratio. The first LOOP_FL 3 is employed when a digital system is used.

The cutoff frequency for the second LOOP_FL 5 having a good C/N ratio of the PLL frequency synthesizer is set at a low value. The low cutoff frequency of the second LOOP_FL 5, however, causes a slower lockup time. The second LOOP_FL 5 is employed when an analog system is used.

The first LOOP_FL 3 and the second LOOP_FL 5 are composed of a lag-lead filter and a low-pass filter.

The dual mode unit may be compatible with the two types, namely, the analog system and the digital system, or compatible with two types of digital system, or compatible with two types of analog system.

Thus, if the PLL frequency synthesizer of a mobile terminal compatible with a plurality of systems must have a quicker lockup time even at the cost of a lower C/N ratio, then the first SW 1 and the second SW 4 are switched by the SW controller 7 to use the first LOOP_FL 3; or if it must have a higher C/N ratio at the cost of a slower lockup time, then the first SW 1 and the second SW 4 are switched by the SW controller 7 to use the second LOOP_FL 5. By so doing, the first VCO circuit 4, the PLL circuit 2, and the reference frequency generator 1 constituting a part of the PLL frequency synthesizer of the mobile terminal compatible with a plurality of systems are shared by the plurality of systems to permit a simpler constitution of the PLL frequency synthesizer of the mobile terminal compatible with a plurality of systems with resultant lower cost for manufacturing the PLL frequency synthesizer of the mobile terminal compatible with the plurality of systems.

Moreover, since the mobile terminal is compatible with a plurality of systems, the service area of the mobile terminal is expanded, leading to greater convenience of the portable terminal.

Embodiment 2

Another embodiment of the PLL frequency synthesizer in accordance with the present invention will be described in conjunction with FIG. 2.

Figure 2:
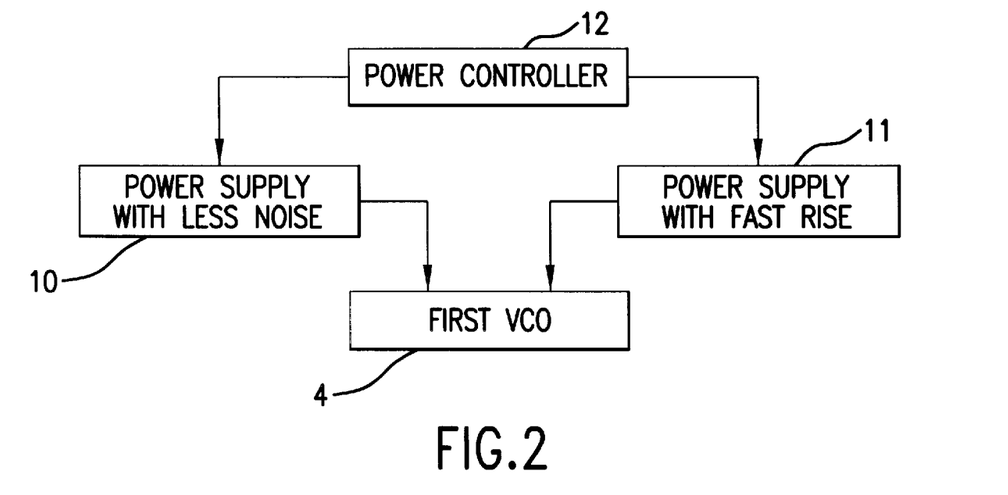
FIG. 2 is a block diagram showing a PLL frequency synthesizer of embodiment 2.

FIG. 2 is a block diagram showing the PLL frequency synthesizer of embodiment 2.

Referring to FIG. 2, a detailed description will be given of the section related to the first VCO circuit 4 in the PLL frequency synthesizer of embodiment 1.

In FIG. 2, reference numeral 4 denotes a first VCO circuit.

Reference numeral 10 denotes a first power supply which is connected to the first VCO circuit 4 and which has less noise but a slow rise.

Reference numeral 11 denotes a second power supply which is connected to the first VCO circuit 4 and which has more noise but a faster rise.

Reference numeral 12 denotes a power controller which is connected to the first power supply 10 and the second power supply 11 and selects the first power supply 10 with less noise or the second power supply 11 with a faster rise as the power supply for supplying electric power to the first VCO circuit 4.

The switching timing of the power controller 12 is slightly earlier than the switching timing of the SW controller 8 in order to issue the signal of a predetermined frequency for actuating the synthesizer to the PLL circuit 2.

When the first VCO circuit 4 is receiving the electric power supplied from the first power supply 10 having less noise, the first VCO circuit 4 is not receiving the electric power from the second power supply 11 having a faster rise.

When the first VCO circuit 4 is receiving the electric power supplied from the second power supply 11 having a faster rise, the first VCO circuit 4 is not receiving the electric power from the first power supply 10 having less noise.

Thus, if the PLL frequency synthesizer of a mobile terminal compatible with a plurality of systems must have a quicker lockup time even at the cost of a lower C/N ratio, then the power controller 12 connects the first power supply 10 having less noise to the first VCO circuit 4 and cuts off the second power supply 11 having a faster rise from the first VCO circuit 4; or if the PLL frequency synthesizer must have a higher C/N ratio at the cost of a slower lockup time, then the power controller 12 connects the second power supply 11 having a faster rise to the first VCO circuit 4 and cuts off the first power supply 10 having less noise from the first VCO circuit 4. By so doing, the first VCO circuit 4, the PLL circuit 2, and the reference frequency generator 1 constituting a part of the PLL frequency synthesizer of the mobile terminal compatible with a plurality of systems are shared by the plurality of systems to permit a simpler constitution of the PLL frequency synthesizer of the mobile terminal compatible with a plurality of systems, thus permitting lower cost for manufacturing the PLL frequency synthesizer of the mobile terminal compatible with the plurality of systems.

Embodiment 3

Still another embodiment of the PLL frequency synthesizer in accordance with the present invention will be described in conjunction with FIG. 3.

Figure 3:
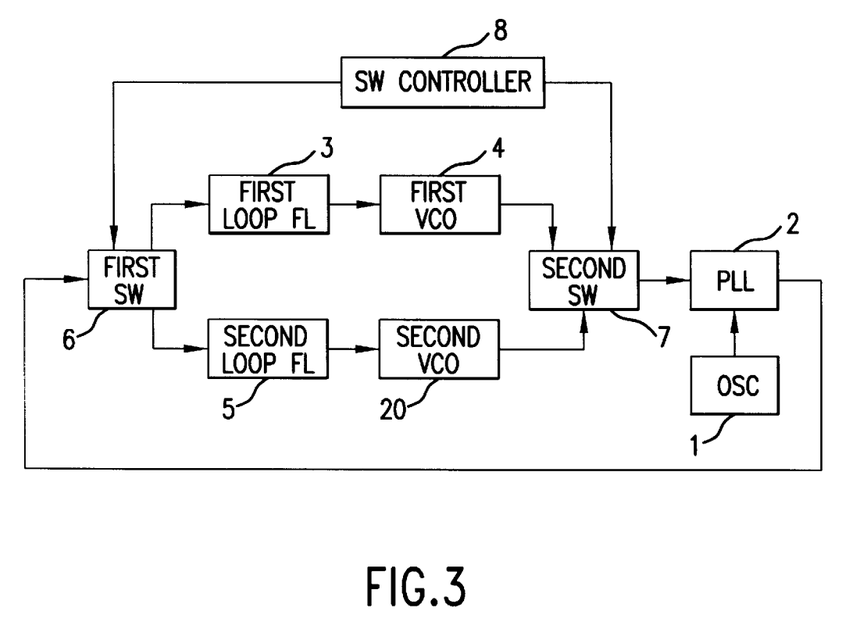
FIG. 3 is a block diagram showing a PLL frequency synthesizer of embodiment 3.

FIG. 3 is a block diagram showing the PLL frequency synthesizer of embodiment 3.

Referring to FIG. 3, reference numeral 1 indicates a reference frequency generator which issues a reference frequency signal.

Reference numeral 2 indicates a PLL circuit which is connected to the reference frequency generator 1 and which divides the reference frequency output from the reference frequency generator 1 by N to provide a first frequency.

The PLL circuit 2 also divides the output frequency received from a first VCO circuit 4 or a second VCO circuit 20 by M to provide a second frequency.

The PLL circuit 2 then compares the phase of the first frequency obtained by dividing the output frequency by M with that of the second frequency obtained by dividing the reference frequency by N and issues a phase error signal associated with the phase error of the first frequency and the second frequency.

Reference numeral 3 denotes a first LOOP_FL which is connected to the PLL circuit 2 via a first SW 6 and which smoothes the phase error signal issued from the PLL circuit 2.

Reference numeral 4 denotes a first VCO circuit which is connected to a first LOOP_FL 3 and which outputs, via a second SW 7, a signal of the output frequency based on the phase error signal which has been smoothed by the first LOOP_FL 3.

Reference numeral 5 denotes a second LOOP_FL which is connected to the PLL circuit 2 via the first SW 6 and which smoothes the phase error signal output from the PLL circuit 2.

Reference numeral 20 denotes a second VCO circuit which is connected to a second LOOP_FL 5 and which issues, via the second SW 7, an output frequency signal based on the phase error signal smoothed by the second LOOP_FL 5.

Reference numeral 8 denotes a SW controller which is connected to the first SW 6 and the second SW 7 and which switches the connection between the first SW 6 and the second SW 7 to set whether the phase error signal issued from the PLL circuit 2 should be applied to the first LOOP_FL 3 or the second LOOP_FL 5.

These first SW 6 and the second SW 7 are set to provide electrical connection between the PLL circuit 2, the first LOOP_FL 3, and the first VCO circuit 4, or between the PLL circuit 2, the second LOOP_FL 5, and the first VCO circuit 4.

When the power of the first VCO circuit 4 is ON, the power of the second VCO circuit 20 is OFF, whereas the power of the first VCO circuit 4 is OFF when the power of the second VCO circuit 20 is ON.

Relational expression (1) shown below is established between the output frequency output from the first VCO circuit 4 and the reference frequency output from the reference frequency generator 1;

where F0 indicates output frequency, FS indicates reference frequency, M indicates the dividing number of output frequency, and N indicates the dividing number of reference frequency:

$$F0=(M/N)\times FS \quad (1)$$

Thus, if the PLL frequency synthesizer of a mobile terminal compatible with a plurality of systems must have a quicker lockup time even at the cost of a lower C/N ratio, then the first SW 1 and the second SW 4 are switched by the SW controller 7 to use the first LOOP_FL 3 and the first VCO circuit 4; or if it must have a higher C/N ratio at the cost of a slower lockup time, then the first SW 1 and the second SW 4 are switched by the SW controller 7 to use the second LOOP_FL 5 and the second VCO circuit 20. By so doing, the PLL circuit 2 and the reference frequency generator 1 constituting a part of the PLL frequency synthesizer of the mobile terminal compatible with a plurality of systems are shared by the plurality of systems to permit a simpler constitution of the PLL frequency synthesizer of the mobile terminal compatible with a plurality of systems, thus enabling lower cost for manufacturing the PLL frequency synthesizer of the mobile terminal compatible with the plurality of systems.

Embodiment 4

Yet another embodiment of the PLL frequency synthesizer in accordance with the present invention will be described in conjunction with FIG. 4.

Figure 4:
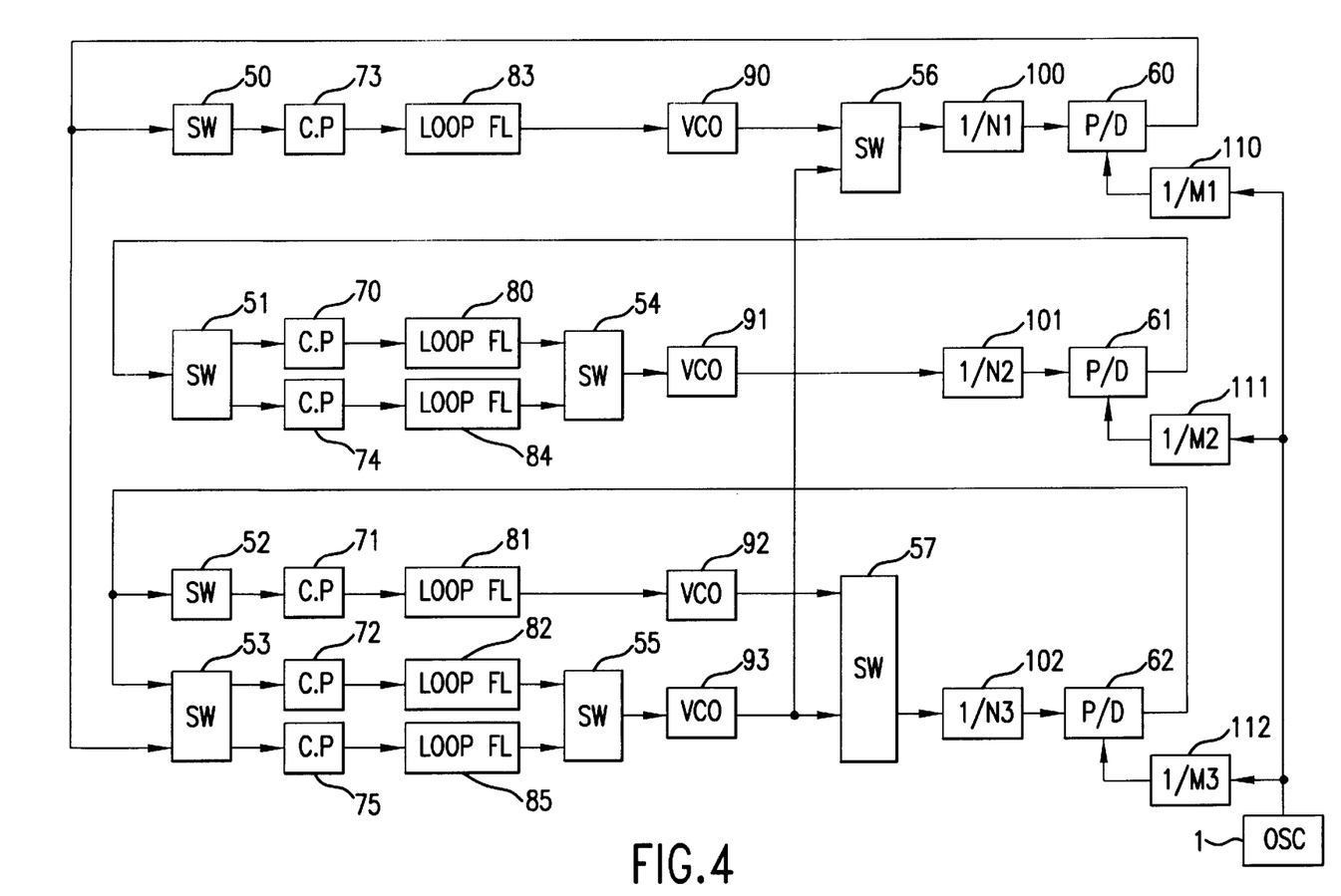
FIG. 4 is a block diagram showing a PLL frequency synthesizer of embodiment 4.

FIG. 4 is a block diagram showing the PLL frequency synthesizer of embodiment 4.

In FIG. 4, reference numerals 50 through 57 indicate switches (hereinafter referred to as "SW").

Reference numerals 60 through 62 indicate phase comparators (hereinafter referred to as "P/D").

The P/D 60 is connected to the SW 50 through SW 53. The P/D 61 is connected to the SW 51. The P/D 62 is connected to the SW 52 and the SW 53.

Reference numerals 70 through 75 denote amplifiers (hereinafter referred to as "C.P").

The C.P 70 and C.P 74 are connected to the SW 51. The C.P 71 is connected to the SW 52. The C.P 72 and C.P 75 are connected to the SW 53. The C.P 73 is connected to the SW 50.

Reference numerals 80 through 85 denote loop filters (hereinafter referred to as "LOOP_FL").

The LOOP_FL 80 is connected to the C.P 70. The LOOP_FL 81 is connected to the C.P 71. The LOOP_FL 82 is connected to the C.P 72. The LOOP_FL 83 is connected to the C.P 73. The LOOP_FL 84 is connected to the C.P 74. The LOOP_FL 85 is connected to the C.P 75.

Of these LOOP_FLs 80 through 85, the LOOP_FLs 80 through 82 are used in an analog mode.

Accordingly, the cutoff frequencies for the LOOP_FLs 80 through 82 are set at low values to satisfy predetermined requirements.

Of these LOOP_FLs 80 through 85, the LOOP_FLs 83 through 85 are used in a digital mode.

Accordingly, the cutoff frequencies for the LOOP_FLs 83 through 85 are set at high values to satisfy predetermined requirements.

The predetermined requirements regarding the LOOP_FLs 80 through 85 are shown in Tables 1 and 2.

Reference numerals 90 through 93 denote voltage controlled oscillators (hereinafter referred to as "VCO").

The VCO circuit 90 is connected to the LOOP_FL 83. The VCO circuit 91 is connected to the LOOP_FL 80 and the LOOP_FL 84 via a SW 54. The VCO circuit 92 is connected to the LOOP_FL 81. The VCO circuit 93 is connected to the LOOP_FL 82 and the LOOP_FL 85 via a SW 55.

Reference numerals 100 through 102 denote variable frequency dividers (hereinafter referred to as "1/N").

The 1/N 100 is connected to the VCO circuit 90 and the VCO circuit 93 via a SW 56. The 1/N 101 is connected to the VCO circuit 91. The 1/N 102 is connected to the VCO circuit 92 and the VCO circuit 93 via a SW 57.

The 1/N 100 is also connected to the P/D 60. The 1/N 101 is also connected to the P/D 61. The 1/N 102 is also connected to the P/D 62.

Reference numerals 110 through 112 denote reference frequency dividers (hereinafter referred to as "1/M").

The 1/M 110 is provided between an OSC 1 and the P/D 60. The 1/M 111 is provided between the OSC 1 and the P/D 61. The 1/M 112 is provided between the OSC 1 and the P/D 62.

The P/D 60, the 1/N 100, and the 1/M 110 together form one PLL circuit 2. Likewise, the P/D 61, the 1/N 101, and the 1/M 111 together form another PLL circuit 2.

The 1/M 110 through 112 divide entered reference frequency signals by predetermined numbers. The predetermined frequency dividing numbers for the analog mode and the digital mode, respectively, are shown in Table 5.

In the analog mode, the SW 50 through SW 53 receive the phase error signals output from the P/D 60 through P/D 62 connected thereto, and output the received phase error signals to the C.P 70 through C.P 72.

In the digital mode, the SW 50 through SW 53 receive the phase error signals output from the P/D 60 through P/D 62 connected thereto, and output the received phase error signals to the C.P 73 through C.P 75.

In the analog mode, the SW 50 is turned OFF and nothing is output from the SW 50.

In the analog mode, the SW 53 receives the phase error signals output from the P/D 60 and the P/D 62, and the SW 53 also outputs the phase error signal received from the P/D 60.

In the digital mode, the SW 52 is turned OFF and nothing is output from the SW 52.

In the digital mode, the SW 53 receives the phase error signals output from the P/D 60 and the P/D 62, and the SW 53 also outputs the phase error signal received from the P/D 62.

The phase error signals output from the SW 50 through SW 53 are supplied to the C.P 70 through C.P 75.

The C.P 70 through C.P 75 amplify the power of the phase error signals.

After that, the C.P 70 through C.P 75 output the phase error signals, the power of which has been amplified, to the LOOP_FLs 80 through 85.

The LOOP_FLs 80 through 85 smooth the supplied phase error signals.

Then the LOOP_FLs 80 through 85 out put the smoothed phase error signals to the SW 54 and SW 55 or the VCO circuits 90 through 93.

The SW 54 and SW 55 output the supplied phase error signals to the VCO circuits 90 through 93.

In the analog mode, the SW 54 and SW 55 are controlled so that they output the phase error signals received from the LOOP_FL 80 or 82, while they do not output the phase error signals received from the LOOP_FL 84 or 85.

In the digital mode, the SW 54 and SW 55 are controlled so that they output the phase error signals received from the LOOP_FL 84 or 85, while they do not output the phase error signals received from the LOOP_FL 80 or 82.

The VCO circuits 90 through 93 generate and output the signals of the predetermined frequencies based on the supplied phase error signals.

The phase error signals supplied to the VCO circuits 90 through 93 are smoothed by the LOOP_FLs 80 through 85.

Table 3 shows the transmission frequency range that is the frequency range in which the signals can be transmitted from the VCO circuits 90 through 93.

The VCO circuits 90 through 93 output the signals of predetermined frequencies to the SW 56 and SW 57 or the 1/N 101.

In the analog mode, the SW 56 receives a signal of a predetermined frequency output from the VCO circuit 93 and it outputs the signal of the predetermined frequency received from the VCO circuit 93 to the 1/N 100.

In the digital mode, the SW 56 receives a signal of a predetermined frequency output from the VCO circuit 90 and it outputs the signal of the predetermined frequency received from the VCO circuit 90 to the 1/N 100.

In the analog mode, the SW 57 receives a signal of a predetermined frequency output from the VCO circuit 92 and it outputs the signal of the predetermined frequency received from the VCO circuit 92 to the 1/N 102.

In the digital mode, the SW 57 receives a signal of a predetermined frequency output from the VCO circuit 93 and it outputs the signal of the predetermined frequency received from the VCO circuit 93 to the 1/N 102.

The 1/N 100 through 1/N 102 divide the supplied signals of the predetermined frequencies and output them to the P/D 60 through P/D 62.

The 1/N 100 through 1/N 102 divide supplied output frequency signals by predetermined numbers. The predetermined frequency dividing numbers for the analog mode and the digital mode, respectively, are given in Table 4.

OSC 1 denotes a reference frequency generator which is supposed to generate an accurate 39-MHz signal in this embodiment 4.

The P/D 60 through P/D 62 compare the phases of the frequencies supplied from the 1/N 100 through 1/N 102 and the 1/M 110 through 1/M 112 and output phase error signals based on the comparison results.

Figure 5:
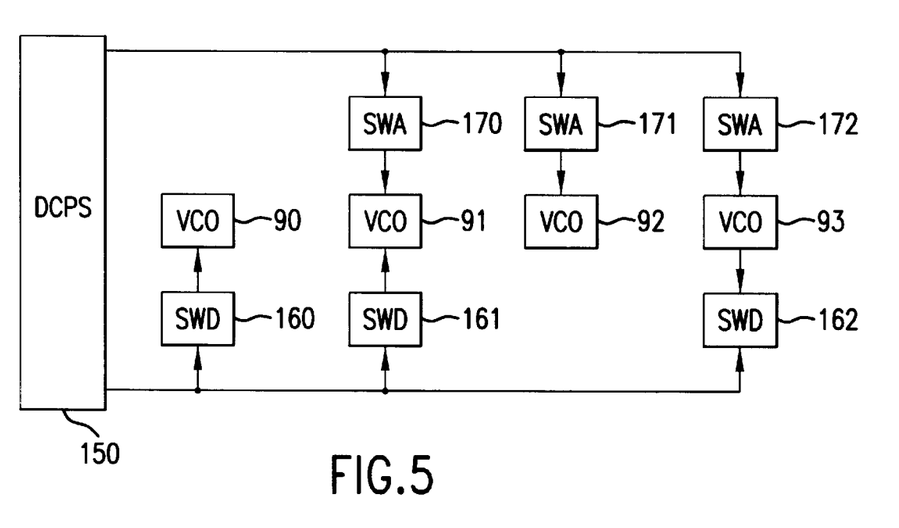
FIG. 5 is a block diagram showing a part associated with VCO circuits 90 through 93 in the PLL frequency synthesizer of embodiment 4.

Referring now to FIG. 5, a detailed description will be given of the VCO circuits 90 through 93 in the PLL frequency synthesizer of embodiment 4.

FIG. 5 is a block diagram showing the section related to the VCO circuits 90 through 93 in the PLL frequency synthesizer of embodiment 4.

In FIG. 5, reference numeral 150 indicates a DC power supply (hereinafter referred to as "DCPS").

Reference numerals 160 through 162 indicate digital mode switches (hereinafter referred to as "SWD").

Reference numerals 170 through 172 indicate analog mode switches (hereinafter referred to as "SWA").

When the digital mode has been selected, the SWD 160 through SWD 162 are turned ON, whereas the SWA 170 through SWA 172 are turned OFF.

When the analog mode has been selected, the SWA 170 through SWD 172 are turned ON, whereas the SWD 160 through SWD 162 are turned OFF.

The SWD 160 through SWD 162 are the switches featuring fast rises to meet the standard of the time required for any given channel to be converged on after the power of the PLL frequency synthesizer is turned ON, the PLL frequency synthesizer corresponding to the specifications when the digital mode shown in Table 1 is used.

The SWA 170 through SWA 172 are the switches which meet the standard of the time required for any given channel to be converged on after the power of the PLL frequency synthesizer is turned ON, the PLL frequency synthesizer corresponding to the specifications when the analog mode shown in Table 2 is used, and which are also capable of reducing the noises of power supplies to meet the requirements for predetermined C/N ratio and S/N ratio.

Figure 6:
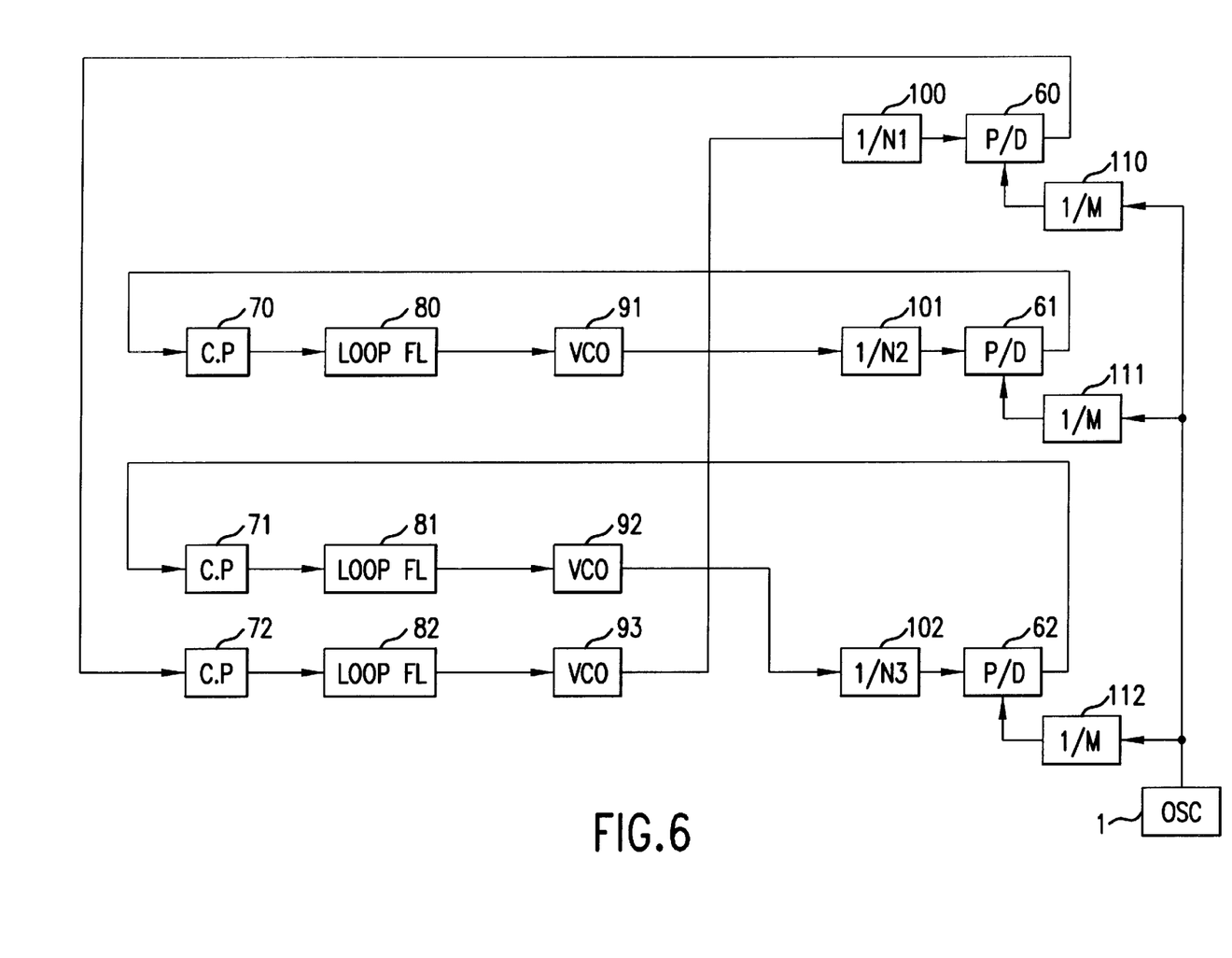
FIG. 6 is a conceptual diagram illustrating the flows of signals when the PLL frequency synthesizer of embodiment 4 is used in an analog mode.
Figure 7:
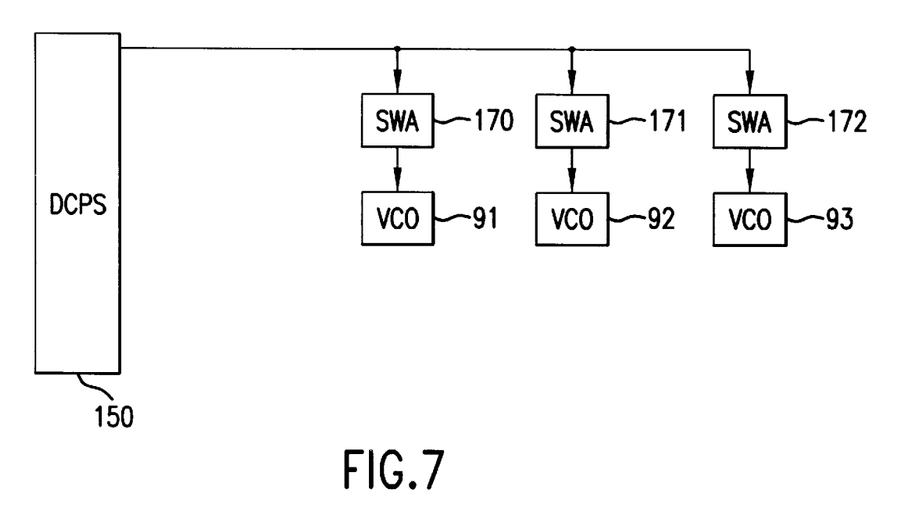
FIG. 7 is a conceptual diagram illustrating a power supply route from a DCPS 150 to the VCO circuits 91 through 93 when the PLL frequency synthesizer of embodiment 4 is used in the analog mode.

When the PLL frequency synthesizer of embodiment 4 is used in the analog mode, the signals flow as illustrated in FIG. 6. When the PLL frequency synthesizer of embodiment 4 is used in the analog mode, the electric power is supplied from the DCPS 150 to the VCO circuits 91 through 93 as illustrated in FIG. 7. When the electric power is supplied from the DCPS 150 to the VCO circuits 91 through 93, the SWA 170 through SWA 172 are turned ON, whereas the SWD 160 through SWD 162 are turned OFF.

Figure 8:
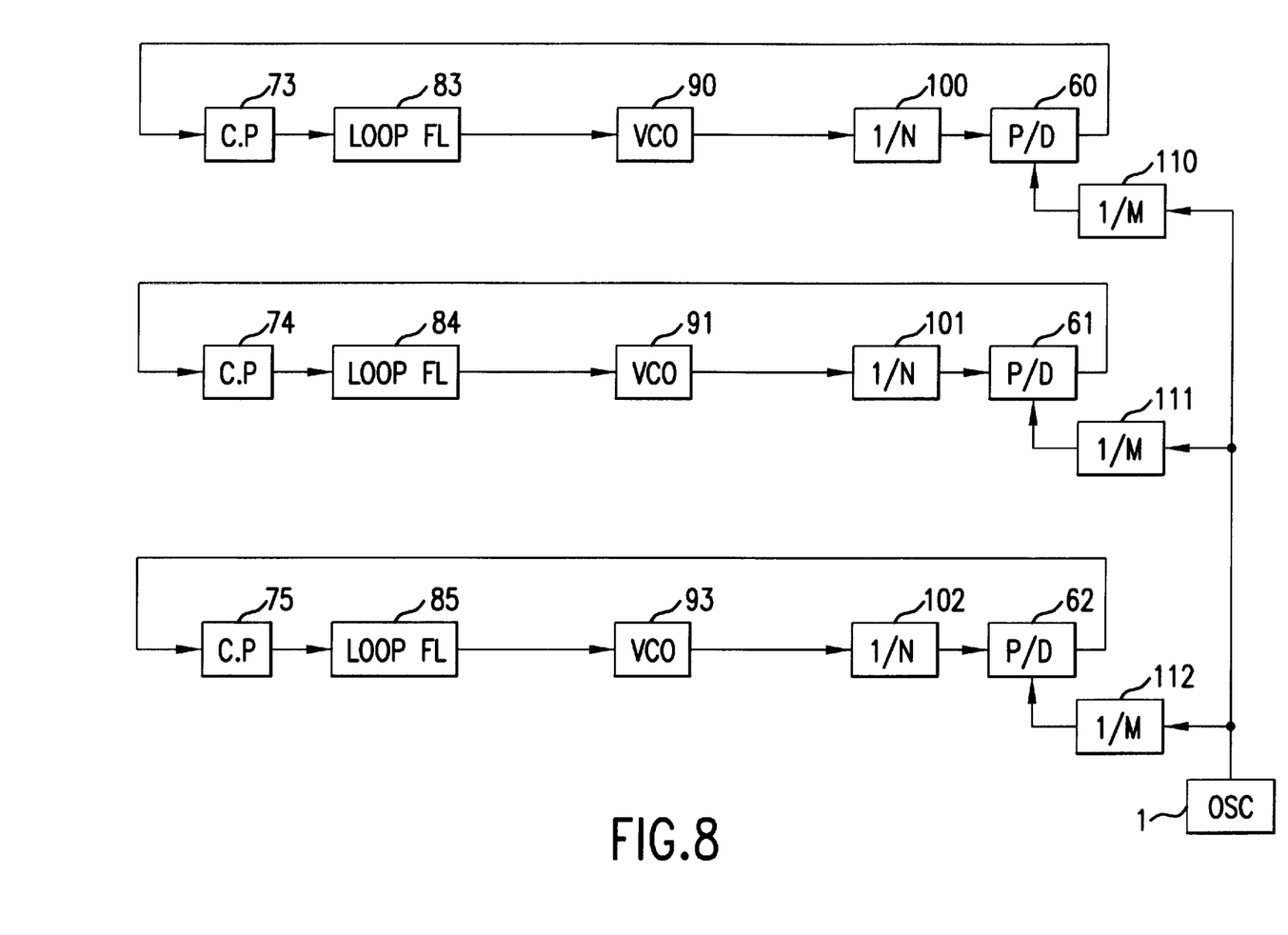
FIG. 8 is a conceptual diagram illustrating the flows of signals when the PLL frequency synthesizer of embodiment 4 is used in a digital mode.
Figure 9:
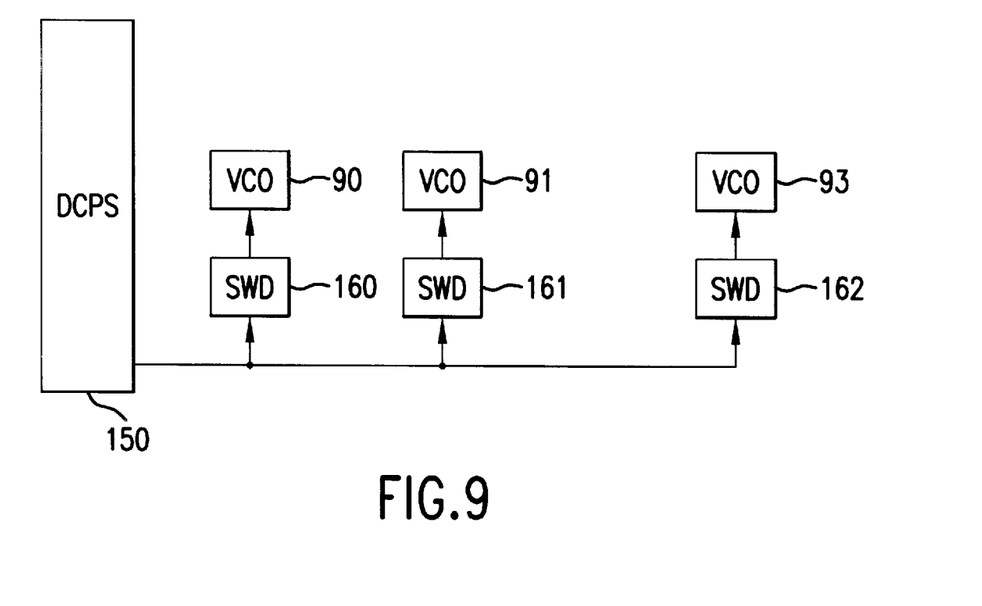
FIG. 9 is a conceptual diagram illustrating a power supply route from the DCPS 150 to the VCO circuits 91 through 93 when the PLL frequency synthesizer of embodiment 4 is used in the digital mode.

When the PLL frequency synthesizer of embodiment 4 is used in the digital mode, the signals flow as illustrated in FIG. 8. When the PLL frequency synthesizer of embodiment 4 is used in the digital mode, the electric power is supplied from the DCPS 150 to the VCO circuits 90, the VCO circuit 91, and the VCO circuit 93 as illustrated in FIG. 9. When the electric power is supplied from the DCPS 150 to the VCO circuit 90, the VCO circuit 91, and the VCO circuit 93, the SWA 170 through SWA 172 are turned OFF, whereas the SWD 160 through SWD 162 are turned ON.

Thus, the P/D 60 through P/D 62, the 1/N 100 through 1/N 102, the 1/M 110 through 1/M 112, the VCO circuit 91, and the VCO circuit 93 which make up a part of the PLL frequency synthesizer of the mobile terminal compatible with a plurality of systems are shared by the plurality of systems to permit a simpler constitution of the PLL frequency synthesizer of the mobile terminal compatible with a plurality of systems, thus permitting lower cost for manufacturing the PLL frequency synthesizer of the mobile terminal compatible with the plurality of systems.

Industrial Applicability

As described above, the PLL frequency synthesizer and the portable terminal employing the PLL frequency synthesizer in accordance with the present invention are suitably used in a plurality of systems.

TABLE 1

| | Required Specifications of Frequency Generator in Analog Mode | |
|---|---|---|
| 1 | Time required for converging on any given CH after turning PLL freq. synthesizer power ON | 35 ms or less |
| 2 | CH interval | 30 kHz |
| 3 | CH switching time | 30 ms or less |
| 4 | F11 | 778.44~803.37 MHz |
| 5 | F12 | 824.04~848.97 MHz |
| 6 | F13 (Fixed) | 362.4 MHz |
| 7 | C/N of VCO | 70 dBC (30 kHz band at 60 KHz deviation) |
| 8 | S/N of VCO | 40 dBC (Band of 300 Hz to 3 kHz at 8 kHz deviation and 1 kHz tone) |

* F11 and F12 assign 778.44 MHz and 824.04 MHz to 1 CH. After that, the channel number increases to 2 CH, 3 CH, and so on for each additional 30 kHz. The last CH will be 832 CH assigned to 803.37 MHz and 848.97 MHz.
nCH of F11 is denoted as F11(n), where n is a natural number ranging from 1 to 832.
nCH of F12 is denoted as F12(n), where n is a natural number ranging from 1 to 832.

TABLE 1-continued

| Required Specifications of Frequency Generator in Analog Mode |
|---|

* CH switching time means the converging time when an arbitrary CH is changed over to another arbitrary CH. It is regarded that look has been completed when convergence has reached a point of ±1 kHz of a target CH. Regarding the time required for convergence on a given CH after the PLL frequency synthesizer power is turned ON, it is also considered that the look has been completed when convergence has reached a point of ±1 kHz.

TABLE 2

| | Required Specifications of Frequency Generator in Digital Mode | |
|---|---|---|
| 1 | Time required for converging on any given CH after turning PLL freq. synthesizer power ON | 1.5 ms or less |
| 2 | CH interval | 200 kHz |
| 3 | CH switching time | 500 us or less |
| 4 | F21 | 1037.2~1096.8 MHz |
| 5 | F22 | 802.4 MHz |
| 6 | F13 (Fixed) | 362.4 MHz |
| 7 | C/N of VCO | No particular Requirements |
| 8 | S/N of VCO | No particular requirements |

* F21 assigns 1037.2 MHz to 1 CH. After that, the channel number increases to 2 CH, 3 CH, and so on for each additional 200 kHz. The last channel will be 299 CH assigned to 1096.8 MHz.
nCH of F21 is denoted as F21(n), where n is a natural number ranging from 1 to 299.

TABLE 3

| VCO 1 | 1037.2 to 1096.8 MHz |
|---|---|
| VCO 2 | 778.44 to 803.37 MHz |
| VCO 3 | 824.04 to 848.97 MHz |
| VCO 4 | 362.4 MHz |

TABLE 4

| | Analog Mode | Digital Mode |
|---|---|---|
| 1/N 1 | 1812 (Fixed) | 5186 (1 CH) to 5484 (299 CH) |
| 1/N 2 | 25948 (1 CH) to 26779 (832 CH) | 4012 (Fixed) |
| 1/N 3 | 27468 (1 CH) to 28299 (832 CH) | 1812 (Fixed) |

TABLE 5

| | Analog Mode | Digital Mode |
|---|---|---|
| 1/M 1 | 195 | 195 |
| 1/M 2 | 1300 | 195 |
| 1/M 3 | 1300 | 195 |

What is claimed is:
1. A PLL frequency synthesizer comprising:
a reference frequency generator which issues a first frequency signal;
a PLL section which is connected to said reference frequency generator, which receives said first frequency signal and a second frequency signal, and outputs a phase error signal based on said first frequency signal and said second frequency signal;
a first filter which is connected to said PLL section, which smoothes said phase error signal output from said PLL section according to a first reference characteristic, and which outputs a first smoothed phase error signal;

a second filter which is connected to said PLL section, which smoothes said phase error signal output from said PLL section according to a second reference characteristic, and outputs a second smoothed phase error signal;

a switch which is connected to said first filter and to said second filter and which issues either said first smoothed phase error signal output from said first filter or said second smoothed phase error signal output from said second filter in accordance with a changeover signal applied to said switch;

an output frequency generator which is connected to said switch and to said PLL section and which issues to said PLL section said second frequency signal based on said first smoothed phase error signal or said second smoothed phase error signal; and a switch controller which is connected to said switch to control the changeover of said switch by issuing said changeover signal;

said switch controller controlling the changeover of said switch such that said first smoothed phase error signal is applied to said output frequency generator when the output of the frequency synthesizer is applied to a first communication system, and said second smoothed phase error signal is applied to said output frequency generator when the output of the frequency synthesizer is applied to a second communication system, said output frequency generator outputting a frequency within a predetermined frequency range encompassing both said first and second communication systems; wherein said output frequency generator has a first power supply and a second power supply, so that said first power supply is selected when said switch is changed over to the connection with said first filter by said switch controller, while said second power supply is selected when said switch is changed over to the connection with said second filter by said switch controller.

2. A PLL frequency synthesizer comprising:

a reference frequency generator which issues a first frequency signal;

a PLL section which is connected to said reference frequency generator, which receives said first frequency signal and a second frequency signal, and which outputs a phase error signal based on said first frequency signal and said second frequency signal;

a first filter which smoothes said phase error signal according to a first reference characteristic, and which outputs a first smoothed phase error signal;

a second filter which smoothes said phase error signal according to a second reference characteristic, and which outputs a second smoothed phase error signal;

a switch which is connected between said PLL section and said first filter and said second filter, and which issues said phase error signal issued from said PLL section in response to a changeover signal;

an output frequency generator which is connected to said first filter, said second filter, and said PLL section, which issues said second frequency signal based on said first smoothed phase error signal or said second smoothed phase error signal to said PLL section; and a switch controller which is connected to said switch to control the changeover of said switch by issuing said changeover signal;

said switch controller controlling the changeover of said switch such that said first smoothed phase error signal is applied to said output frequency generator when the output of the frequency synthesizer is applied to a first communication system, and said second smoothed phase error signal is applied to said output frequency generator when the output of the frequency synthesizer is applied to a second communication system, said output frequency generator outputting a frequency within a predetermined frequency range encompassing both said first and second communication systems; wherein said output frequency generator has a first power supply and a second power supply, so that said first power supply is selected when said switch is changed over to the connection with said first filter by said switch controller, while said second power supply is selected when said switch is changed over to the connection with said second filter by said switch controller.

3. A PLL frequency synthesizer according to claim 1, wherein: said first power supply defines the time required for a rise as a first time and has less variations in output voltage, while said second power supply has more variations in output voltage than in said first power supply and defines the time required for a rise as a second time which is shorter than said first time.

4. A PLL frequency synthesizer according to claim 1, wherein: said PLL section has a first frequency divider, a second frequency divider, and a comparator; said first frequency divider is connected to said reference frequency generator and it divides a received first frequency signal into a third frequency signal and issues it; said second frequency divider is connected to said output frequency generator and it divides a received second frequency signal into a fourth frequency signal and issues it; and said comparator is connected to said first frequency divider and said second frequency divider to compare the phases of said third frequency signal and said fourth frequency signal, and it outputs a phase error signal based on a comparison result.

5. A PLL frequency synthesizer comprising:

a reference frequency generator which issues a first frequency signal;

a PLL section which is connected to said reference frequency generator, which receives said first frequency signal and a second frequency signal, and which outputs a phase error signal based on said first frequency signal and said second frequency signal;

a first filter which is connected to said PLL section, which smoothes said phase error signal output from said PLL section according to a first reference characteristic, and which outputs a first smoothed phase error signal;

a second filter which is connected to said PLL section, which smoothes said phase error signal output from said PLL section according to a second reference characteristic, and which outputs a second smoothed phase error signal;

a first output frequency generator which is connected to said first filter and which outputs a second frequency signal based on said first smoothed phase error signal;

a second output frequency generator which is connected to said second filter and which outputs a second frequency signal based on the second smoothed phase error signal;

a switch which is connected to said first output frequency generator, said second output frequency generator, and said PLL section, and which outputs to said PLL section in response to a changeover signal said first smoothed phase error signal issued from said first output frequency generator or said second smoothed phase error signal issued from said second output frequency generator; and a switch controller which is connected to said switch to control the changeover of said switch by issuing said changeover signal;

said switch controller controlling the changeover of said switch such that said first smoothed phase error signal is applied to said first output frequency generator when the output of the frequency synthesizer is applied to a first communication system, and said second smoothed phase error signal is applied to said second output frequency generator when the output of the frequency synthesizer is applied to a second communication system, said first and second output frequency generators outputting a frequency within a predetermined frequency range encompassing both said first and second communication systems.

6. A PLL frequency synthesizer according to claim 1, wherein: said PLL section has a first frequency divider, a second frequency divider, and a comparator; said first frequency divider is connected to said reference frequency generator and it divides a received first frequency signal into a third frequency signal and issues it; said second frequency divider is connected to said first output frequency generator or said second output frequency generator via said switch and it divides a received second frequency signal into a fourth frequency signal and issues it; and said comparator is connected to said first frequency divider and said second frequency divider to compare the phases of said third frequency signal and said fourth frequency signal and it outputs a phase error signal based on a comparison result.

7. A PLL frequency synthesizer according to claim 1, wherein: a first reference of said first filter is used to set the cutoff frequency of said first filter to a first level, and a second reference of said second filter is used to set the cutoff frequency of said second filter at a second level that is higher than said first level.

8. A PLL frequency synthesizer according to claim 1, wherein said PLL frequency synthesizer is used in a portable terminal used for communications, such that said portable terminal contains said PLL frequency synthesizer.

9. A PLL frequency synthesizer according to claim 8, wherein: if said portable terminal is used with a first system, then said first filter is used by changing over said switch, while if said portable terminal is used with a second system, then said second filter is used by changing over said switch.

10. A PLL frequency synthesizer according to claim 9, wherein said first system is an analog system, while said second system is a digital system.

11. A PLL frequency synthesizer according to claim 9, wherein said switch is changed over by said switch controller according to the intensity of an applied received signal of said portable terminal.

12. A PLL frequency synthesizer according to claim 9, wherein said switch controller selects said first system when the intensity of an applied first received signal regarding said first system exceeds a predetermined reference, whereas it selects said second system when the intensity of said first received signal is lower than said predetermined reference.

13. A PLL frequency synthesizer according to claim 9, wherein said switch controller compares the intensity of an applied first received signal regarding said first system with the intensity of an applied second received signal regarding said second system, and it selects said first system if the intensity of said first received signal is higher than the intensity of said second received signal or selects said second system if the intensity of said second received signal is higher than the intensity of said first received signal.

14. A PLL frequency synthesizer according to claim 12, wherein, when said switch controller selects said first system, processing based on said first received signal regarding said first system that has been entered by said portable terminal is implemented, or when said switching controller selects said second system, processing based on said second received signal regarding said second system that has been entered by said portable terminal is implemented.

15. A PLL frequency synthesizer according to claim 2, wherein: said first power supply defines the time required for a rise as a first time and has less variations in output voltage, while said second power supply has more variations in output voltage than in said first power supply and defines the time required for a rise as a second time which is shorter than said first time.

16. A PLL frequency synthesizer according to claim 5, wherein said PLL frequency synthesizer is used in a portable terminal used for communications, such that said portable terminal contains said PLL frequency synthesizer.

17. A PLL frequency synthesizer according to claim 16, wherein: if said portable terminal is used with a first system, then said first filter is used by changing over said switch, while if said portable terminal is used with a second system, then said second filter is used by changing over said switch.

18. A PLL frequency synthesizer according to claim 17, wherein said first system is an analog system, while said second system is a digital system.

* * * * *